United States Patent
Matsui

(10) Patent No.: US 11,990,464 B2
(45) Date of Patent: May 21, 2024

(54) SEMICONDUCTOR INTEGRATED CIRCUIT DEVICE INCLUDING OPPOSITE FACING I/O CELLS IN 2×2 COLUMNS

(71) Applicant: SOCIONEXT INC., Kanagawa (JP)

(72) Inventor: Toru Matsui, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 570 days.

(21) Appl. No.: 17/204,797

(22) Filed: Mar. 17, 2021

(65) Prior Publication Data
US 2021/0202468 A1 Jul. 1, 2021

Related U.S. Application Data

(63) Continuation of application No. PCT/JP2018/036192, filed on Sep. 28, 2018.

(51) Int. Cl.
*H01L 27/02* (2006.01)
*H01L 27/11* (2006.01)
*H01L 27/118* (2006.01)

(52) U.S. Cl.
CPC .... *H01L 27/0207* (2013.01); *H01L 27/11898* (2013.01); *H01L 2224/0613* (2013.01);
(Continued)

(58) Field of Classification Search
CPC ........... H01L 27/0207; H01L 27/11898; H01L 24/05; H01L 24/06; H01L 2224/05012;
(Continued)

(56) References Cited

U.S. PATENT DOCUMENTS 5,083,181 A 1/1992 Yoshida et al.
5,369,595 A * 11/1994 Gould ................. H01L 27/0207
257/203
(Continued)

FOREIGN PATENT DOCUMENTS

EP 1205974 A2 * 5/2002 ........... G06F 30/392
JP H101-140641 A 6/1989
(Continued)

OTHER PUBLICATIONS

International Search Report and Written Opinion issued in International Patent Application No. PCT/JP2018/036192, dated Nov. 20, 2018; with partial English translation.

Primary Examiner — Ida M Soward
(74) Attorney, Agent, or Firm — Rimon P.C.

(57) ABSTRACT

Provided is a semiconductor integrated circuit device including a plurality of columns of IO cells and having a configuration capable of reducing wiring delays without causing an increase in the area. The semiconductor integrated circuit device includes a first IO cell column group including an IO cell column closest to a periphery of a chip, and a second IO cell column group including an IO cell column adjacent to the first IO cell column group at the side closer to the core region. At least one of the first IO cell column group or the second IO cell column group includes two or more IO cell columns, and the two or more IO cell columns are aligned in the second direction such that the lower power supply voltage regions face each other or the higher power supply voltage regions face each other.

14 Claims, 9 Drawing Sheets

(52) U.S. Cl.
CPC ............... *H01L 2224/06134* (2013.01); *H01L 2224/0616* (2013.01); *H01L 2224/06163* (2013.01); *H01L 2224/06177* (2013.01)

(58) Field of Classification Search
CPC ... H01L 2224/0612; H01L 2224/06133; H01L 2224/06139; H01L 2224/06134; H01L 2224/0613; H01L 2224/0616; H01L 2224/06163; H01L 2224/06177; H01L 2924/14

See application file for complete search history.

(56) References Cited

U.S. PATENT DOCUMENTS

| | | | |
|---|---|---|---|
| 6,013,924 A | 1/2000 | Osajima et al. | |
| 6,919,632 B2 | 7/2005 | Sei | |
| 2002/0004930 A1 | 1/2002 | Ohno | |
| 2002/0113319 A1* | 8/2002 | Ohno | H01L 24/81 |
| | | | 257/E23.079 |
| 2003/0057549 A1 | 3/2003 | Sei | |
| 2005/0127405 A1* | 6/2005 | Chen | H01L 27/11898 |
| | | | 257/E27.11 |
| 2006/0230375 A1* | 10/2006 | Casey | G06F 30/392 |
| | | | 716/117 |
| 2006/0236175 A1* | 10/2006 | Usami | H01L 24/06 |
| | | | 714/724 |
| 2008/0111255 A1* | 5/2008 | Matsuoka | H01L 24/06 |
| | | | 257/E23.079 |
| 2009/0113370 A1 | 4/2009 | Yoshinaga | |
| 2011/0285448 A1 | 11/2011 | Gion | |
| 2015/0331985 A1* | 11/2015 | Sharma | G06F 30/392 |
| | | | 716/135 |
| 2020/0083252 A1* | 3/2020 | Sobue | H01L 21/82 |

FOREIGN PATENT DOCUMENTS

| | | | | |
|---|---|---|---|---|
| JP | H02-306650 A | | 12/1990 | |
| JP | H10-189743 A | | 7/1998 | |
| JP | H10189743 A | * | 7/1998 | ............ H01L 24/06 |
| JP | 2002-26130 A | | 1/2002 | |
| JP | 2003-100891 A | | 4/2003 | |
| JP | 2004179184 A | * | 6/2004 | ............ H01L 24/06 |
| JP | 2009-111119 A | | 5/2009 | |
| JP | 2009-152456 A | | 7/2009 | |
| JP | 2009152456 A | * | 7/2009 | |
| JP | 2016-046358 A | | 4/2016 | |
| WO | 2011/065022 A1 | | 6/2011 | |

* cited by examiner

SEMICONDUCTOR INTEGRATED CIRCUIT DEVICE INCLUDING OPPOSITE FACING I/O CELLS IN 2×2 COLUMNS

CROSS-REFERENCE IO RELATED APPLICATIONS

This is a continuation of International Application No. PCT/JP2018/036192 filed on Sep. 28, 2018. The entire disclosure of the application is incorporated by reference herein.

BACKGROUND

The present disclosure relates to a semiconductor integrated circuit device including a core region and an IO region which are arranged on a chip.

In recent years, semiconductor integrated circuits have further increased in scale to have an increasing number of input and output signals. Accordingly, input/output cells (IO cells) in one column arrangement around a core region limits the area of the semiconductor integrated circuit, which may increase the area of a device including the semiconductor integrated circuit, that is, a semiconductor integrated circuit device.

Japanese Unexamined Patent Publication No. 2003-100891 discloses a configuration of a semiconductor integrated circuit device including IO cells arranged in two columns. U.S. Patent Application Publication No. 2005/0127405 discloses a configuration of a semiconductor device including IO cells arranged in one, two, and three columns. U.S. Pat. No. 6,919,632 discloses a configuration of a semiconductor integrated circuit device including IO cells arranged with internal signal terminals adjacent to each other.

SUMMARY

IO cells typically include a higher power supply voltage region including an ESD circuit or an output buffer for outputting signals to the outside of a semiconductor integrated circuit device, for example, and a lower power supply voltage region including a circuit section for inputting/outputting signals from/to the inside of the semiconductor integrated circuit device, for example. The lower power supply voltage region uses the same power supply voltage as the internal circuit formed in the core region of the chip.

In addition, with a recent progress of miniaturization, the power supply voltage inside a chip decreases. However, the power supply voltage outside the chip is not as low as the power supply voltage inside the chip. In particular, the voltage does not decrease in some cases due to various interface standards, for example. Therefore, in IO cells, the power supply potentials of the higher and lower power supply voltage regions are largely different from each other.

There is thus a large difference in voltages applied to transistors and wells between the higher and lower power supply voltage regions, which tends to cause breakdown due to what is called a "latch-up error." In order to avoid latch-up errors, a sufficiently increased distance is needed between the transistors and/or the wells of the higher and lower power supply voltage regions. In particular, in a higher power supply voltage region, this approach is needed for an output buffer and/or an ESD circuit that is directly connected to an external terminal of a chip and more prone to noise from the outside of the chip.

In a structure where IO cells are arranged in a plurality of columns, since an IO cell in the column closest to the periphery of a chip is far from a core region, which makes signal lines longer, thereby making delays of the signal lines larger.

The present disclosure was made to solve the problems described above.

A semiconductor integrated circuit according to an aspect of the present disclosure includes: a chip; a core region on the chip; and an IO region provided between the core region and a periphery of the chip on the chip. The IO region includes 2×N IO cell columns, where N is an integer of two or more, including a plurality of IO cells aligned in a first direction that is along a periphery of the chip. The IO cell columns are aligned in a second direction perpendicular to the first direction. Each of the IO cells includes a lower power supply voltage region and a higher power supply voltage region which are separately provided in the second direction. The IO cell columns include a first IO cell column group including a first IO cell column in a position closest to the periphery of the chip with the lower power supply voltage region facing the core region, and a second IO cell column group including a second IO cell column in a position closest to the core region with the lower power supply voltage region facing the core region. At least one of the first IO cell column group or the second IO cell column group includes two or more IO cell columns, and the two or more IO cell columns are aligned in the second direction such that the lower power supply voltage regions face each other or the higher power supply voltage regions face each other.

The semiconductor integrated circuit device according to this aspect includes, out of the 2N IO cell columns in the IO region, the first IO cell column in the position closest to the periphery of the chip with the lower power supply voltage region facing the core region. With this configuration, the distance from the first IO cell of the IO cell column to the core region is shorter than that in the case where the lower power supply voltage region of the first IO cell column faces the periphery of the chip, which reduces wiring delays. Out of the 2N IO cell columns, the second IO cell column is disposed in the position closest to the core region with the lower power supply voltage region facing the core region. There is thus no need to keep a space for avoiding latch-up errors between the first IO cell column and the core region. At least one of the first IO cell column group or the second IO cell column group includes two or more IO cell columns that are aligned in the second direction such that the lower power supply voltage regions face each other or the higher power supply voltage regions face each other. This configuration reduces an increase in the area.

The semiconductor integrated circuit device according to the present disclosure reduces wiring delays without causing an increase in the area of the semiconductor integrated circuit, even in a structure where IO cells are arranged in a plurality of columns.

DETAILED DESCRIPTION

Embodiments will be described with reference to the drawings.

Figure 1:
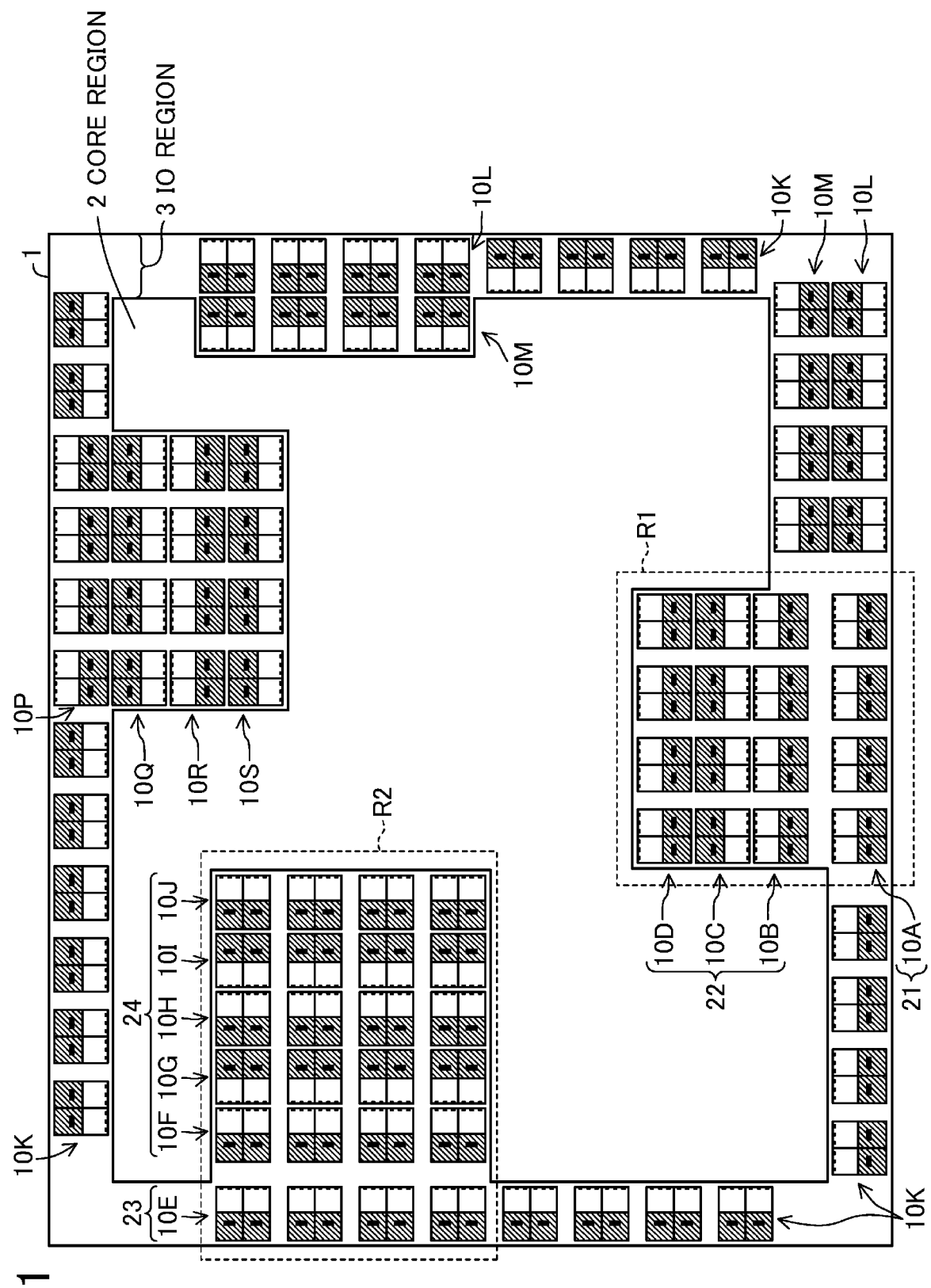
FIG. 1 is a top view schematically showing an overall configuration of a semiconductor integrated circuit device according to an embodiment.

FIG. 1 is a top view schematically showing an overall configuration of a semiconductor integrated circuit device according to an embodiment. The semiconductor integrated circuit device shown in FIG. 1 includes, on a chip 1, a core region 2 with inner core circuits, and an IO region 3 with interface circuits (i.e., IO circuits). The IO region 3 is located around the core region 2. The IO region 3 includes a single IO cell column 10K, two IO cell columns 10L and 10M, four IO cell columns 10A to 10D, four IO cell columns 10P to 10S, and six IO cell columns 10E to 10J along the periphery of the chip 1. The arrangement of the IO cell columns in the IO region 3 is not limited to the one shown in FIG. 1. For example, all the IO cell columns of the IO region 3 may be "2×N" columns, where N is an integer of two or more. The IO cell columns of the IO region 3 may include eight or more IO cell columns, or may include an odd number of, such as three or five, IO cell columns. Although not shown in FIG. 1, a plurality of external connection pads are arranged in the semiconductor integrated circuit device 1.

Figure 2:
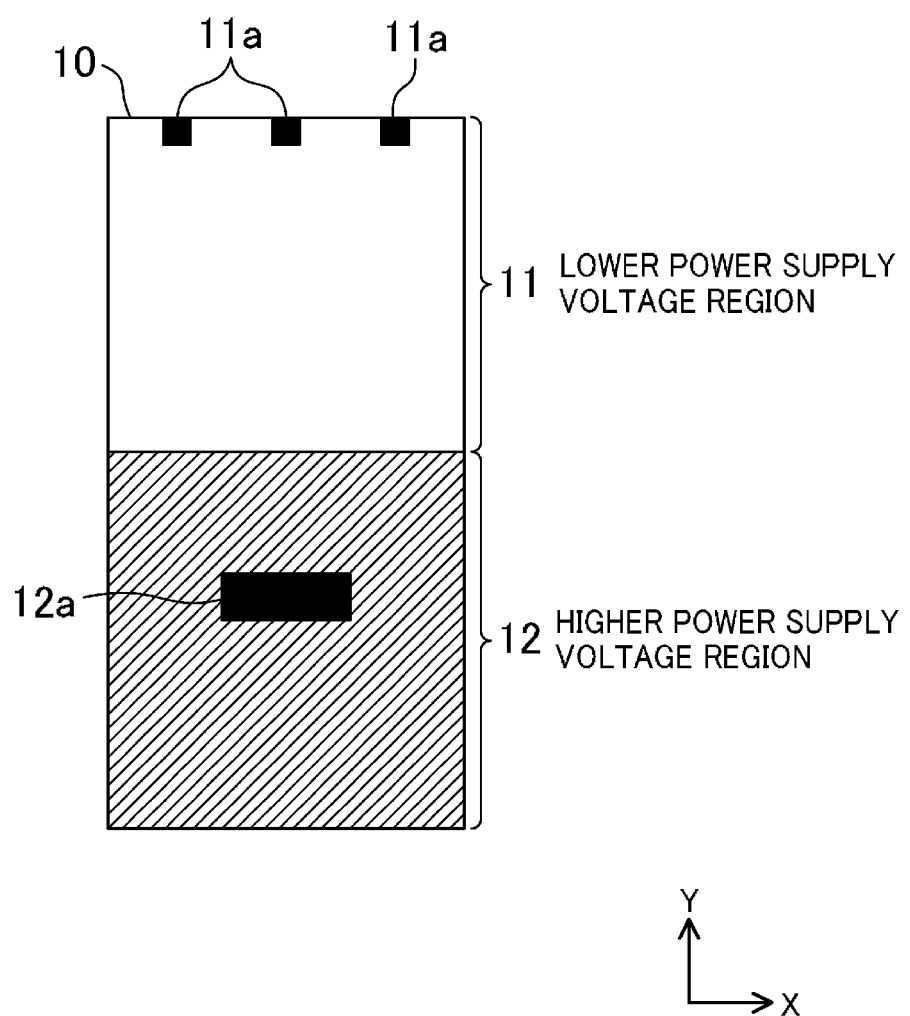
FIG. 2 shows a configuration example of an IO cell.

FIG. 2 shows a configuration example of an IO cell 10. In FIG. 2, the internal components (e.g., devices such as transistors or diodes), signal lines, and power supply lines, for example, of the IO cell 10 are not shown. The same applies to the subsequent drawings. In general, the IO cell 10 includes a lower power supply voltage region 11 and a higher power supply voltage region 12. The IO cell 10 of FIG. 2 is divided into the lower and higher power supply voltage regions 11 and 12 in a Y-direction (i.e., vertically in the drawing). The lower power supply voltage region 11 includes a circuit section for inputting/outputting signals from/to the inside of the semiconductor integrated circuit device, and internal input/output terminals 11a, for example. The higher power supply voltage region 12 includes an output buffer for outputting signals to the outside of an ESD circuit and/or a semiconductor integrated circuit device, and an external input/output terminal 12a, for example. Here, an X-direction is along the periphery of the chip 1 and corresponds to the "first direction" in which the IO cells 10 are aligned. The Y-direction is from the periphery of the chip 1 toward the core region 2, and corresponds to the "second direction" perpendicular to the X-direction in a plan view. The internal input/output terminals 11a of the lower power supply voltage region 11 may be input terminals, output terminals, or power supply terminals. The external internal input/output terminal 12a of the higher power supply voltage region 12 may be an input terminal, an output terminal, or a power supply terminal.

First Embodiment

Figure 3:
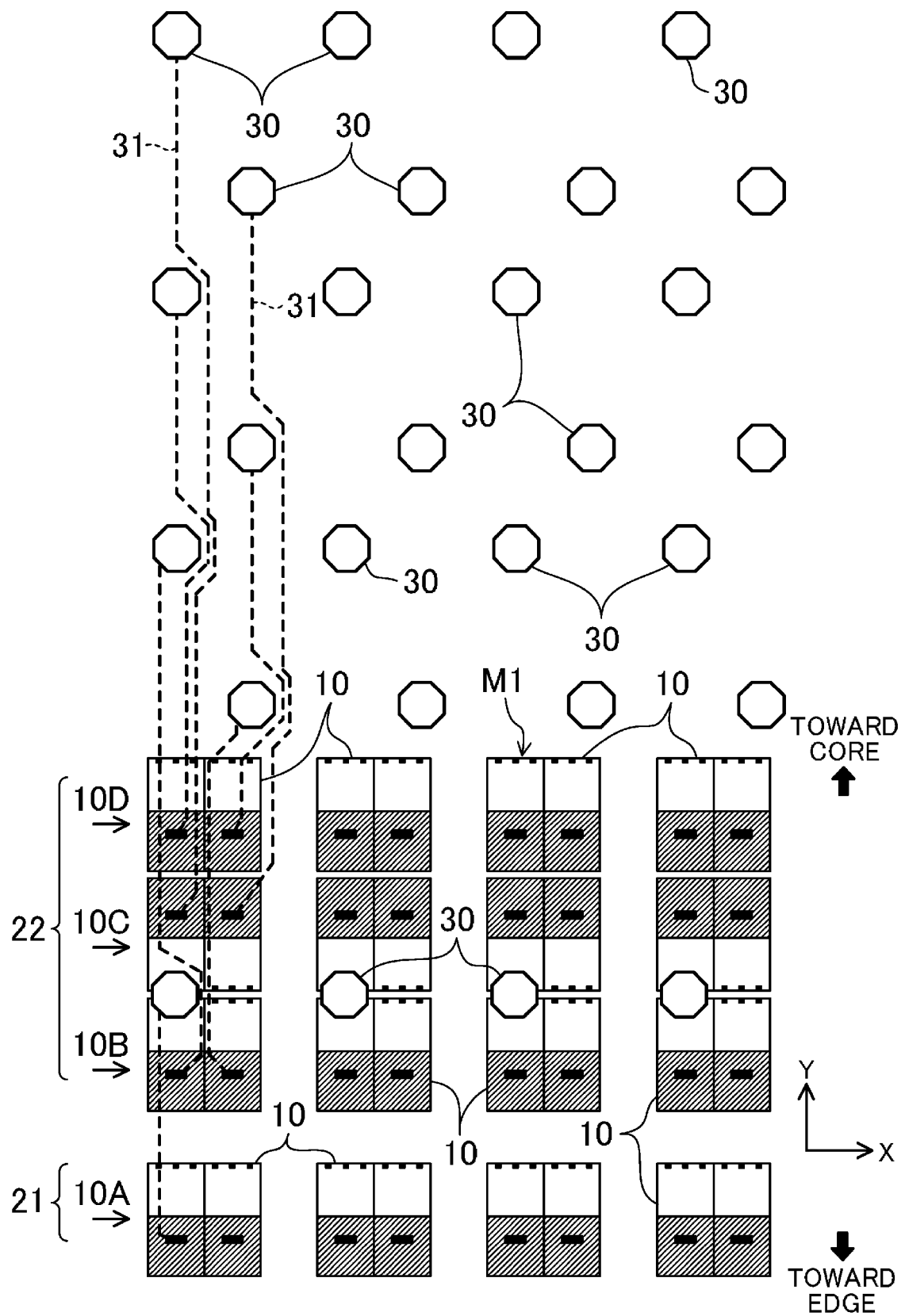
FIG. 3 shows an arrangement example and a wiring example between pads and IO cells.

FIG. 3 shows an arrangement example of IO cells 10 in a semiconductor integrated circuit device according to a first embodiment, and corresponds to an enlarged view of a region R1 in FIG. 1. In FIG. 3, each of four IO cell columns 10A to 10D includes a plurality of (eight in FIG. 3) IO cells 10 arranged in the X-direction (i.e., horizontally in the drawing, along the periphery of the chip 1). The columns are aligned in the Y-direction (i.e., vertically in the drawing, from the periphery of the chip 1 toward the core region 2). FIG. 3 shows pads 30 for connection to the outside of the chip 1. In addition, the eight IO cells 10 on the left of the drawing are connected to some of the pads 30 by connection wires 31 indicated by broken lines.

In the arrangement example of FIG. 3, a first IO cell column group 21 includes one IO cell column 10A corresponding to the "first IO cell column."

The IO cell column 10A is located closest to the periphery of the chip 1 among 2×N IO cell columns (here, IO cell columns 10A to 10D), where N is an integer of two or more and N is two in FIG. 3, aligned in the Y-direction. In the IO cell column 10A, the IO cells 10 are arranged with the lower power supply voltage region 11 located closer to the core region 2.

A second IO cell column group 22 includes three columns of the IO cell columns 10B, 10C, and 10D each corresponding to the "second IO cell column."

The IO cell column 10D is located closest to the core region 2 among 2×N (four in FIG. 3) IO cell columns (here, IO cell columns 10A to 10D) aligned in the Y-direction. In the IO cell column 10D, the IO cells 10 are arranged with the lower power supply voltage regions 11 located closer to the core region 2. There is thus no need to keep a space for avoiding latch-up errors between the IO cell column 10D and the core region 2 (see an arrow M1 in FIG. 3).

The IO cell column 10C is adjacent to the IO cell column 10D at the side closer to the periphery of the chip 1. The higher power supply voltage regions 12 of the IO cell columns 10C and 10D face each other. There is thus no need to keep a space for avoiding latch-up errors between the IO cell columns 10C and 10D.

The IO cell column 10B is adjacent to the IO cell column 10C at the side closer to the periphery of the chip 1. The lower power supply voltage regions 11 of the IO cell columns 10B and 10C face each other. There is thus no need to keep a space for avoiding latch-up errors between the IO cell columns 10B and 10C.

FIG. 3 shows an example where spaces with a distance b are kept between the IO cell columns 10B and 10C and between the IO cell columns 10C and 10D. However, as described above, since a space for reducing latch-up error is unnecessary, the distance b may be set to 0 in FIG. 3. In addition, the distance between the IO cell columns 10B and 10C may be different from the distance between the IO cell columns 10C and 10D.

The first and second IO cell column groups 21 and 22 are aligned in the Y-direction. The IO cell column 10A has the lower power supply voltage regions 11 at the side closer to the core region 2, whereas the IO cell column 10B has the higher power supply voltage regions 12 at the side closer to the periphery of the chip 1. Accordingly, the low power supply voltage regions 11 of the IO cell column 10A face the higher power supply voltage regions 12 of the IO cell column 10B. Thus, in view of avoiding latch-up errors, a space with a distance a, where a>b, is left between the IO cell columns 10A and 10B.

In the arrangement example in FIG. 3, the IO cells 10 constituting the IO cell columns 10A to 10D are the same in size and position in the Y-direction in the respective columns. In the IO cell columns 10A to 10D, the IO cells 10 facing each other in the second direction are the same in size and position in the X-direction.

Figure 4:
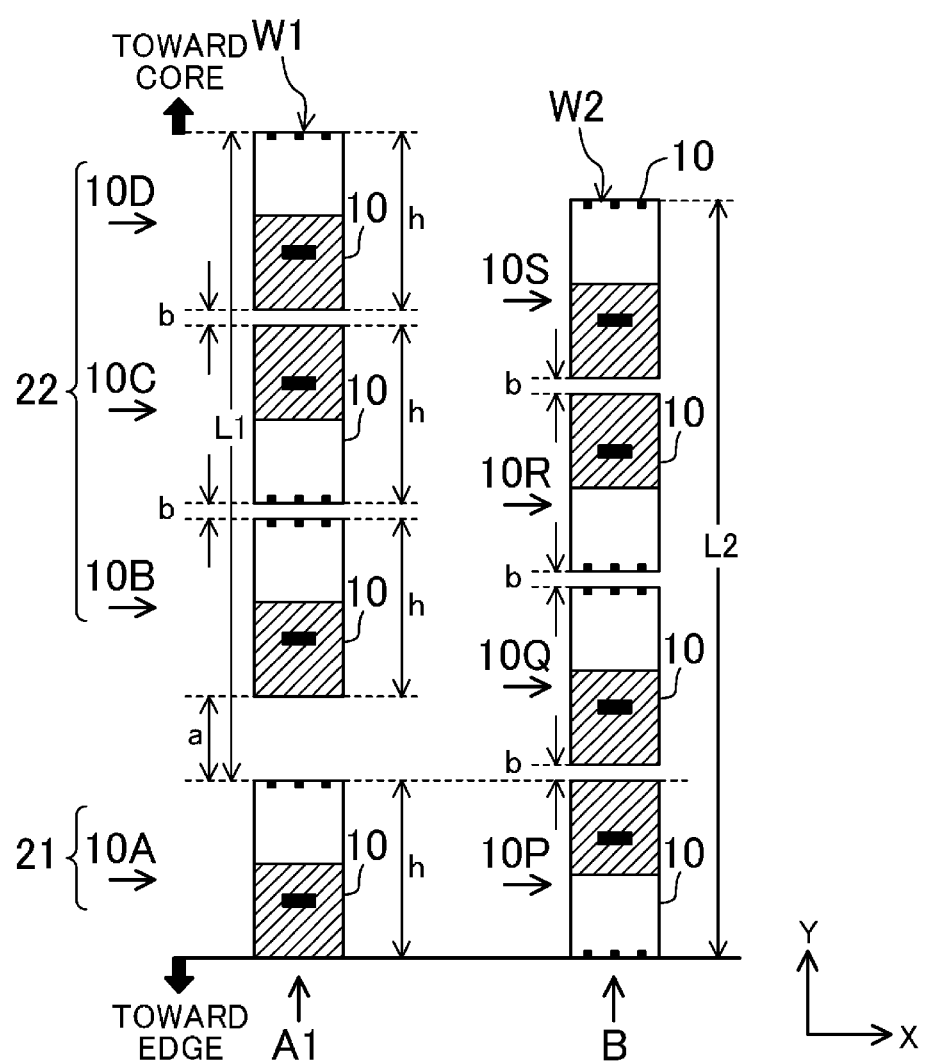
FIG. 4 shows an arrangement example of IO cells and an arrangement of IO cells according to a comparative example.

FIG. 4 shows, as A1, an arrangement example of IO cell columns 10A to 10D (i.e., four columns) according to this embodiment and, as B, an arrangement example of IO cell columns 10P to 10S (i.e., four columns) according to a comparative example. With reference to FIG. 4, an example will be described where each of the IO cell columns 10A to 10D and 10P to 10S includes one IO cell 10.

Although not shown in the figure, the core region 2 and the internal input/output terminals 11a of the lower power supply voltage region 11 are connected by connection wires. In the following description, the length of each connection wire is referred to as a "wiring distance."

In the arrangement example A1, the connection wire (not shown) connecting the core region 2 and the IO cell column 10A closest to the periphery of the chip 1 has the longest wiring distance. Here, assuming that the distance from a boundary W1 between the core region 2 and the IO region 3 to the side of the IO cell column 10A (i.e., the IO cell 10) closer to the core region 2 is considered as a longest wiring distance L1, L1 is shown as follows:

$$L1 = 3 \times h + a + 2 \times b \quad (1)$$

Here, h is the height of the IO cells 10 in the Y-direction, and a and b are distances of the spaces between the IO cells 10 adjacent to each other in the second direction described above.

On the other hand, in the arrangement example B (i.e., the comparative example) of FIG. 4, the four IO cell columns 10P to 10S are arranged, among which the IO cell column 10S is located closest to the core region 2. In the IO cell column 10S, the IO cell 10 is disposed with the lower power supply voltage region 11 closer to the core region 2. At the side of the IO cell column 10S closer to the periphery of the chip 1, the three IO cell columns 10R, 10Q, and 10P are arranged in this order with the positions of the lower and higher power supply voltage regions 11 and 12 inverted from each other. That is, the IO cell column 10P is located closest to the periphery of the chip 1.

Here, like the wiring distance L1, assuming that the distance from a boundary W2 between the core region 2 and the IO region 3 to the side of the IO cell column 10P (i.e., the IO cell 10) closer to the periphery of the chip 1 is considered as a longest wiring distance L2, L2 is shown as follows:

$$L2 = 4 \times h + 3 \times b \quad (2)$$

Here, h is the height of the IO cells 10 in the Y-direction, and b is the distance of the space between the IO cells 10 adjacent to each other in the second direction described above.

The following is obtained from the equations (1) and (2), where h+b>a:

$$L1 < L2 \quad (3)$$

That is, in the arrangement according to the arrangement example A1, the distance from the internal input/output terminals 11a of the IO cell column 10A (i.e., the IO cell 10) closest to the periphery of the chip 1 to the core region 2 is shorter than that in the arrangement according to the arrangement example B (i.e., the comparative example). The former arrangement requires shorter connection wires, thereby reducing wiring delays. In addition, the configuration according to this embodiment is achieved by keeping the distance a for avoiding latch-up errors only between the IO cell column 10A and 10B, which increases only a smaller amount of the area.

The configuration according to this embodiment (i.e., the IO cell columns 10A to 10D) may be applied to all of the four IO cell columns of the IO region 3 of the chip 1, or some of the four IO cell columns (i.e., 10A to 10D and 10P to 10S) as shown in FIG. 1. For example, the configuration (i.e., the IO cell columns 10A to 10D) according to this embodiment may be applied only to a region to which high-speed signals are to be transmitted, and the configuration (i.e., the IO cell columns 10P to 10S) shown in the arrangement example B may be applied to the other regions.

In the arrangement example of FIG. 3, the IO cells 10 constituting the IO cell columns 10A to 10D are the same in size and position in the Y-direction in the respective columns. The configuration according to this embodiment is however not limited thereto. For example, the IO cell 10 constituting the IO cell column 10A may have a different height, for example, a height h1 (here, h1+b>a) from the IO cells 10 constituting the other IO cell columns 10B to 10D. This provides the same advantages.

In the arrangement example of FIG. 3, the first IO cell column group 21 includes the one column and the second IO cell column group 22 includes the three columns. The configuration according to this embodiment is however not limited thereto.

Figure 5:
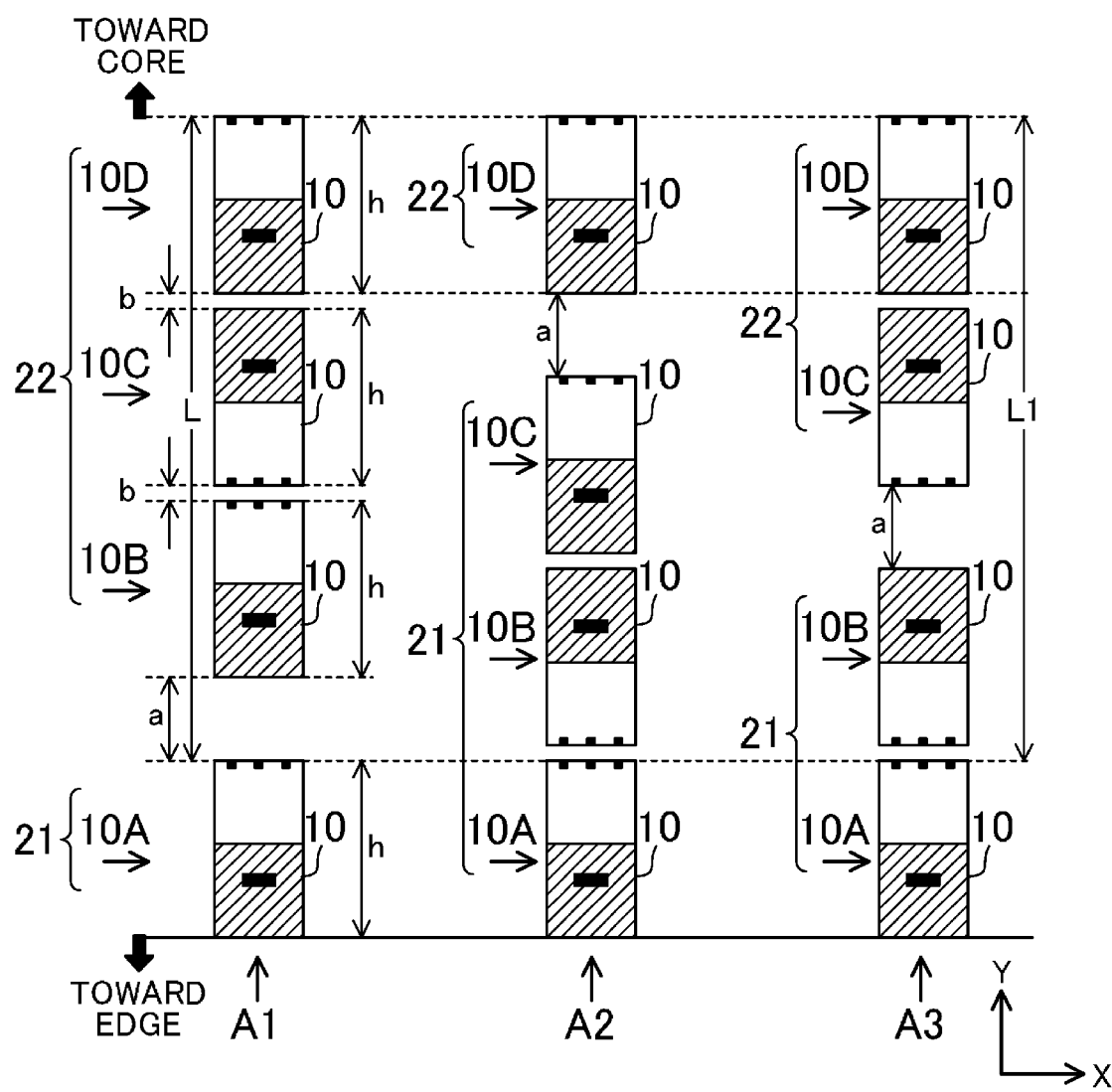
FIG. 5 shows an arrangement of IO cells according to a variation of FIG. 4.

For example, as shown in an arrangement example A2 of FIG. 5, the first IO cell column group 21 may include three IO cell columns 10A to 10C, whereas the second 10 cell column group 22 may include one IO cell column 10D. The IO cell column 10A and 10D are in the same positions as in the embodiment described above. The IO cell column 10B is adjacent to the IO cell column 10A in the Y-direction with the respective lower power supply voltage regions 11 facing each other. The IO cell column 10C is adjacent to the IO cell column 10B in the Y-direction with the respective higher power supply voltage regions 12 facing each other. A space (i.e., a distance a) for avoiding latch-up errors is left between the first IO cell column group 21 (i.e., the lower power supply voltage region 11 of the IO cell column 10C) and the second IO cell column group 22 (i.e., the higher power supply voltage region 12 of the IO cell column 10D).

For example, as shown in an arrangement example A3 of FIG. 5, the first IO cell column group 21 may include two IO cell columns 10A and 10B, whereas the second 10 cell column group 22 may include two IO cell columns 10C and 10D. The IO cell column 10A and 10D are in the same positions as in the embodiment described above. The IO cell column 10B is adjacent to the IO cell column 10A in the Y-direction with the respective lower power supply voltage regions 11 facing each other. The IO cell column 10C is adjacent to the IO cell column 10D in the Y-direction with the respective higher power supply voltage regions 12 facing each other. A space (i.e., a distance a) for avoiding latch-up errors is left between the first IO cell column group 21 (i.e., the higher power supply voltage region 12 of the IO cell column 10B) and the second IO cell column group 22 (i.e., the lower power supply voltage region 11 of the IO cell column 10C).

The arrangement examples A2 and A3 provide the same advantages as that of the arrangement example A1. Specifically, the distance from the internal input/output terminals 11a of the IO cell column 10A (i.e., the IO cell 10) to the core region 2 is shorter than that in the arrangement example B, which reduces wiring delays. However, having a larger number of the IO cell columns 10A to 10D with the shorter distance from the internal input/output terminals 11a to the core region 2, the arrangement example A1 is more preferred than the arrangement examples A2 and A3.

The arrangement examples A2 and A3 are achieved by keeping a space (i.e., a distance a) for avoiding latch-up errors only between the IO cell column groups 21 and 22, which increases only a smaller amount of the area. In addition, there is no need to keep a space for avoiding latch-up errors between the IO cells 10 adjacent to each other in the Y-direction within the IO cell column groups 21 and 22.

Second Embodiment

Figure 6:
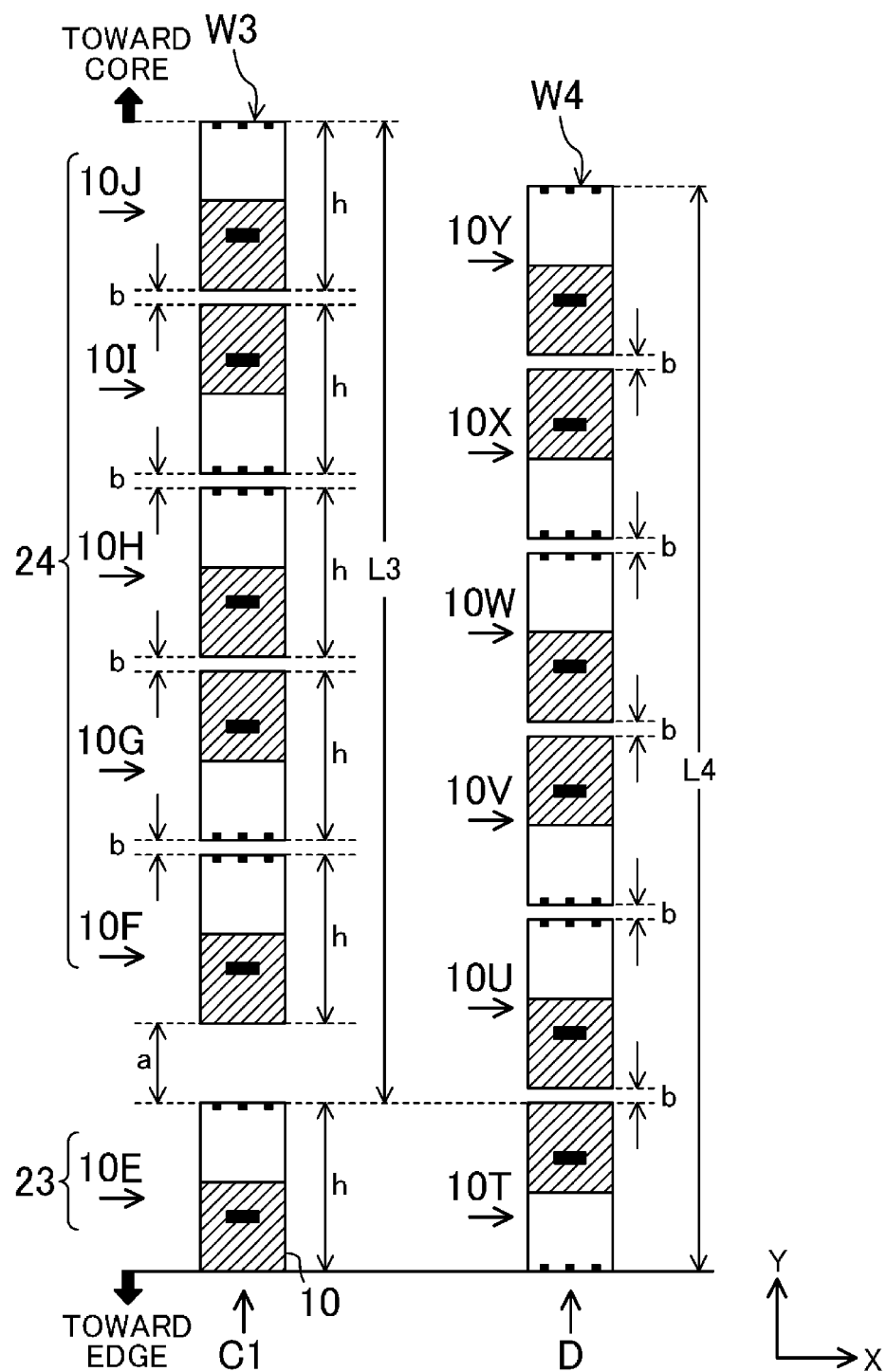
FIG. 6 shows another arrangement example of IO cells and an arrangement of IO cells according to a comparative example.

FIG. 6 shows, as C1, an arrangement example of IO cell columns 10E to 10J (i.e., six columns) according to this embodiment and, as D, an arrangement example of IO cell columns 10T to 10Y (i.e., six columns) according to a comparative example. With reference to FIG. 6, an example will be described where each of the IO cell columns 10E to 10J and 10T to 10Y includes one IO cell 10. As indicated by a region R2 in FIG. 1, each of the IO cell columns 10E to 10J may include a plurality of (eight in FIG. 1) IO cells 10 arranged in the X-direction (i.e., horizontally in the drawing, along the periphery of the chip 1).

In the arrangement example C1, the connection wire (not shown) connecting the core region 2 and the IO cell column 10E closest to the periphery of the chip 1 has the longest wiring distance. Here, assuming that the distance from a boundary W3 between the core region 2 and the IO region 3 to the side of the IO cell column 10E (i.e., the IO cell 10) closer to the core region 2 is considered as a longest wiring distance L3, L3 is shown as follows:

$$L3 = 5 \times h + a + 4 \times b \quad (4)$$

Here, h is the height of the IO cells 10 in the Y-direction, a and b are the distances of the space between the IO cells 10 adjacent to each other in the second direction.

On the other hand, in the arrangement example D (i.e., the comparative example) of FIG. 6, the six IO cell columns 10T to 10Y are arranged, among which the IO cell column 10Y is located closest to the core region 2. In the IO cell column 10Y, the IO cell 10 is disposed with the lower power supply voltage region 11 located closer to the core region 2. At the side of the IO cell column 10Y closer to the periphery of the chip 1, the five IO cell columns 10X, 10W, 10V, 10U, and 10T are arranged in this order with the positions of the lower and higher power supply voltage regions 11 and 12 inverted from each other. That is, the IO cell column 10T is located closest to the periphery of the chip 1.

Here, like the wiring distance L3, assuming that the distance from a boundary W4 between the core region 2 and the IO region 3 to the side of the IO cell column 10T (i.e., the IO cell 10) closer to the periphery of the chip 1 is considered as a longest wiring distance L4, L4 is shown as follows:

$$L4 = 6 \times h + 5 \times b \quad (5)$$

Here, h is the height of the IO cells 10 in the Y-direction, and b is the distance of the space between the IO cells 10 adjacent to each other in the second direction described above.

The following is obtained from the equations (4) and (5), where h+b>a:

$$L3 < L4 \quad (6)$$

That is, in the arrangement according to the arrangement example C1, the distance from the internal input/output terminals 11a of the IO cell column 10E (i.e., the IO cell 10) closest to the periphery of the chip 1 to the core region 2 is shorter than that in the arrangement according to the arrangement example D (i.e., the comparative example). The former arrangement reduces wiring delays. In addition, the configuration according to this embodiment is achieved by keeping a space (i.e., a distance a) for avoiding latch-up errors only between the IO cell columns 10E and 10F, which increases only a smaller amount of the area.

As in the first embodiment, the configuration according to this embodiment (i.e., the IO cell columns 10E to 10J) may be applied to all of the six IO cell columns of the TO region 3 of the chip 1 or to some of the six IO cell columns.

In the arrangement example in FIG. 6, the IO cells 10 constituting the IO cell columns 10E to 10J are the same in size in the Y-direction in the respective columns. However, the configuration according to this embodiment is not limited thereto. For example, the IO cell 10 constituting the IO cell column 10E may have a different height, for example, a height h1 (here, h1+b>a) from the IO cells 10 constituting the other IO cell columns 10F to 10J. This provides the same advantages.

In the arrangement example of FIG. 6, the first IO cell column group 23 includes the one column and the second IO cell column group 24 includes the five columns. The configuration according to this embodiment is however not limited thereto.

Figure 7:
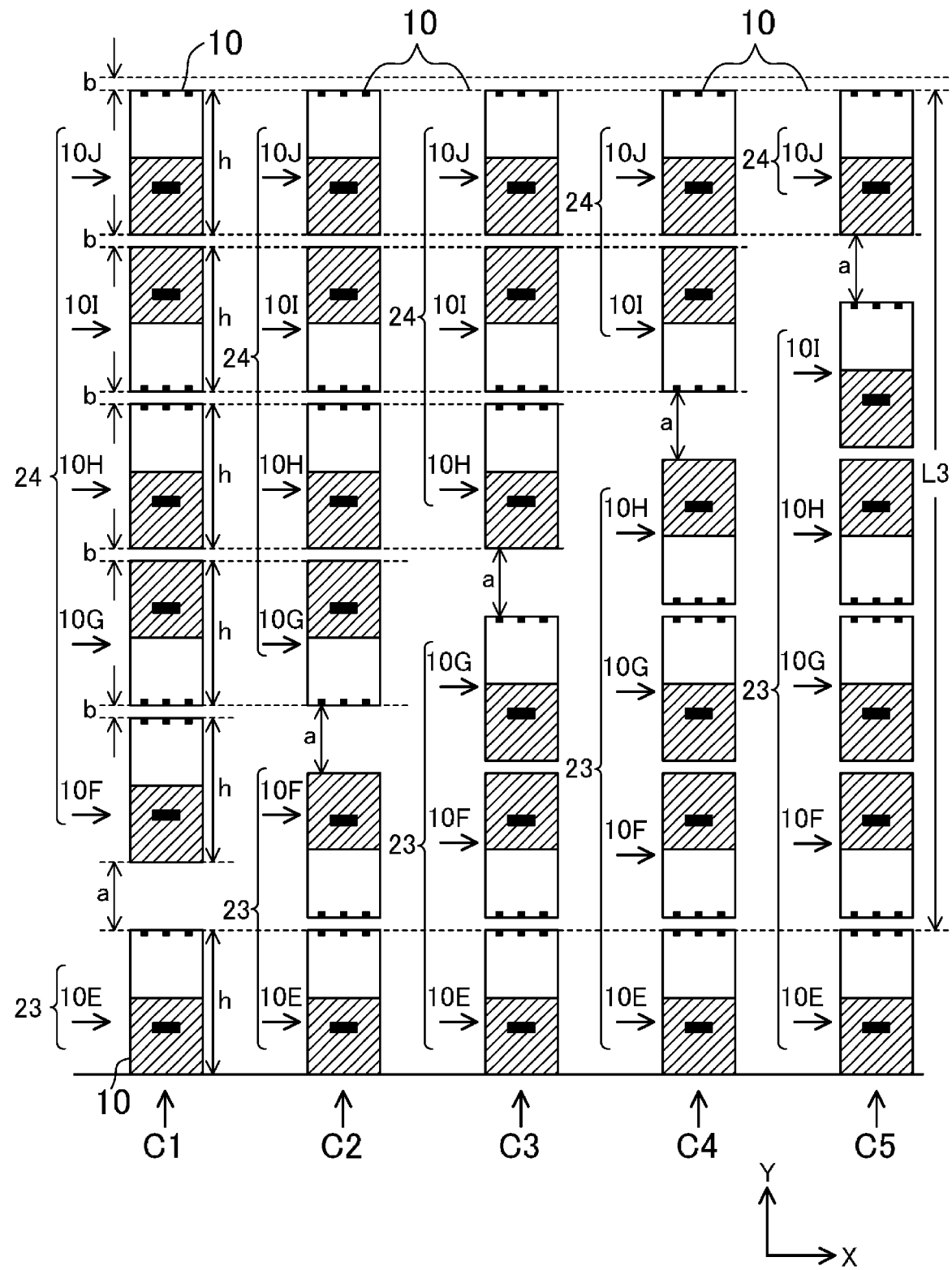
FIG. 7 shows an arrangement of IO cells according to a variation of FIG. 6.

For example, as shown in an arrangement example C2 of FIG. 7, the first IO cell column group 23 may include two IO cell columns 10E and 10F, whereas the second IO cell column group 24 may include four IO cell columns 10G to 10J. The IO cell column 10E and 10J are in the same positions as in the embodiment described above. The IO cell column 10F is adjacent to the IO cell column 10E in the Y-direction with the respective lower power supply voltage regions 11 facing each other. The four IO cell columns 10J, 10I, 10H, and 10G are arranged in this order with the positions of the lower and higher power supply voltage regions 11 and 12 inverted from each other. The IO cell column 10I is located relative to the IO cell column 10J with the respective higher power supply voltage regions 12 facing each other. The IO cell column 10H is located relative to the IO cell column 10I with the respective lower power supply voltage regions 11 facing each other. The IO cell column 10G is located relative to the IO cell column 10H with the respective lower power supply voltage regions 11 facing each other. A space (i.e., a distance a) for avoiding latch-up errors is left between the first IO cell column group 23 (i.e., the higher power supply voltage region 12 of the IO cell column 10F) and the second IO cell column group 24 (i.e., the lower power supply voltage region 11 of the IO cell column 10G).

For example, as shown in an arrangement example C3 of FIG. 7, the first IO cell column group 23 may include three IO cell columns 10E to 10G, whereas the second IO cell column group 24 may include three IO cell columns 10H to 10J. The IO cell columns 10E and 10J are in the same positions as in the above embodiment. The three IO cell columns 10E, 10F, and 10G are arranged in this order with the positions of the lower and higher power supply voltage regions 11 and 12 inverted from each other. The IO cell column 10F is located relative to the IO cell column 10E with the respective lower power supply voltage regions 11 facing each other. The IO cell column 10G is located relative to the IO cell column 10F with the respective higher power supply voltage regions 12 facing each other. The three IO cell columns 10J, 10I, and 10H are arranged in this order with the positions of the lower and higher power supply voltage regions 11 and 12 inverted from each other. The IO cell column 10I is located relative to the IO cell column 10J with the respective higher power supply voltage regions 12 facing each other. The IO cell column 10H is located relative to the IO cell column 10I with the respective lower power supply voltage regions 11 facing each other. A space (i.e., a distance a) for avoiding latch-up errors is left between the first IO cell column group 23 (i.e., the lower power supply voltage region 11 of the IO cell column 10G) and the second IO cell column group 24 (i.e., the higher power supply voltage region 12 of the IO cell column 10H).

For example, as shown in an arrangement example C4 of FIG. 7, the first IO cell column group 23 may include four IO cell columns 10E to 10H, whereas the second IO cell column group 24 may include two IO cell columns 10I and 10J. The IO cell column 10E and 10J are in the same positions as in the embodiment described above. The four IO cell columns 10E, 10F, 10G, and 10H are arranged in this order with the positions of the lower and higher power supply voltage regions 11 and 12 inverted from each other. The IO cell column 10F is located relative to the IO cell column 10E with the respective lower power supply voltage regions 11 facing each other. The IO cell column 10G is located relative to the IO cell column 10F with the respective higher power supply voltage regions 12 facing each other. The IO cell column 10H is located relative to the IO cell column 10G with the respective lower power supply voltage regions 11 facing each other. The IO cell column 10I is located relative to the IO cell column 10J with the respective higher power supply voltage regions 12 facing each other. A space (i.e., a distance a) for avoiding latch-up errors is left between the first IO cell column group 23 (i.e., the higher power supply voltage region 12 of the IO cell column 10H) and the second IO cell column group 24 (i.e., the lower power supply voltage region 11 of the IO cell column 10I).

For example, as shown in an arrangement example C5 of FIG. 7, the first IO cell column group 23 may include five IO cell columns 10E to 10I, whereas the second IO cell column group 24 may include one IO cell column 10J. The IO cell columns 10E and 10J are in the same positions as in the above embodiment. The five IO cell columns 10E, 10F, 10G, 10H, and 10I are arranged in this order with the positions of the lower and higher power supply voltage regions 11 and 12 inverted from each other. The IO cell column 10F is located relative to the IO cell column 10E with the respective lower power supply voltage regions 11 facing each other. The IO cell column 10G is located relative to the IO cell column 10F with the respective higher power supply voltage regions 12 facing each other. The IO cell column 10H is located relative to the IO cell column 10G with the respective lower power supply voltage regions 11 facing each other. The IO cell column 10I is located relative to the IO cell column 10H with the respective higher power supply voltage regions 12 facing each other. A space (i.e., a distance a) for avoiding latch-up errors is left between the first IO cell column group 23 (i.e., the lower power supply voltage region 11 of the IO cell column 10O) and the second IO cell column group 24 (i.e., the higher power supply voltage region 12 of the IO cell column 10J).

The arrangement examples C2 to C5 provide the same advantages as that of the arrangement example C1. Specifically, the distance from the internal input/output terminals 11a of the IO cell column 10E (i.e., the IO cell 10) to the core region 2 is shorter than that in the arrangement example D, which reduces wiring delays. In addition, latch-up errors are avoided by keeping a space (i.e., a distance a) only between the IO cell column groups 23 and 24, which increases only a smaller amount of the area. There is no need to keep a space for avoiding latch-up errors between the IO cell columns 10 adjacent to each other in the Y-direction within the IO cell column groups 23 and 24.

Other Configuration Examples

Figure 8:
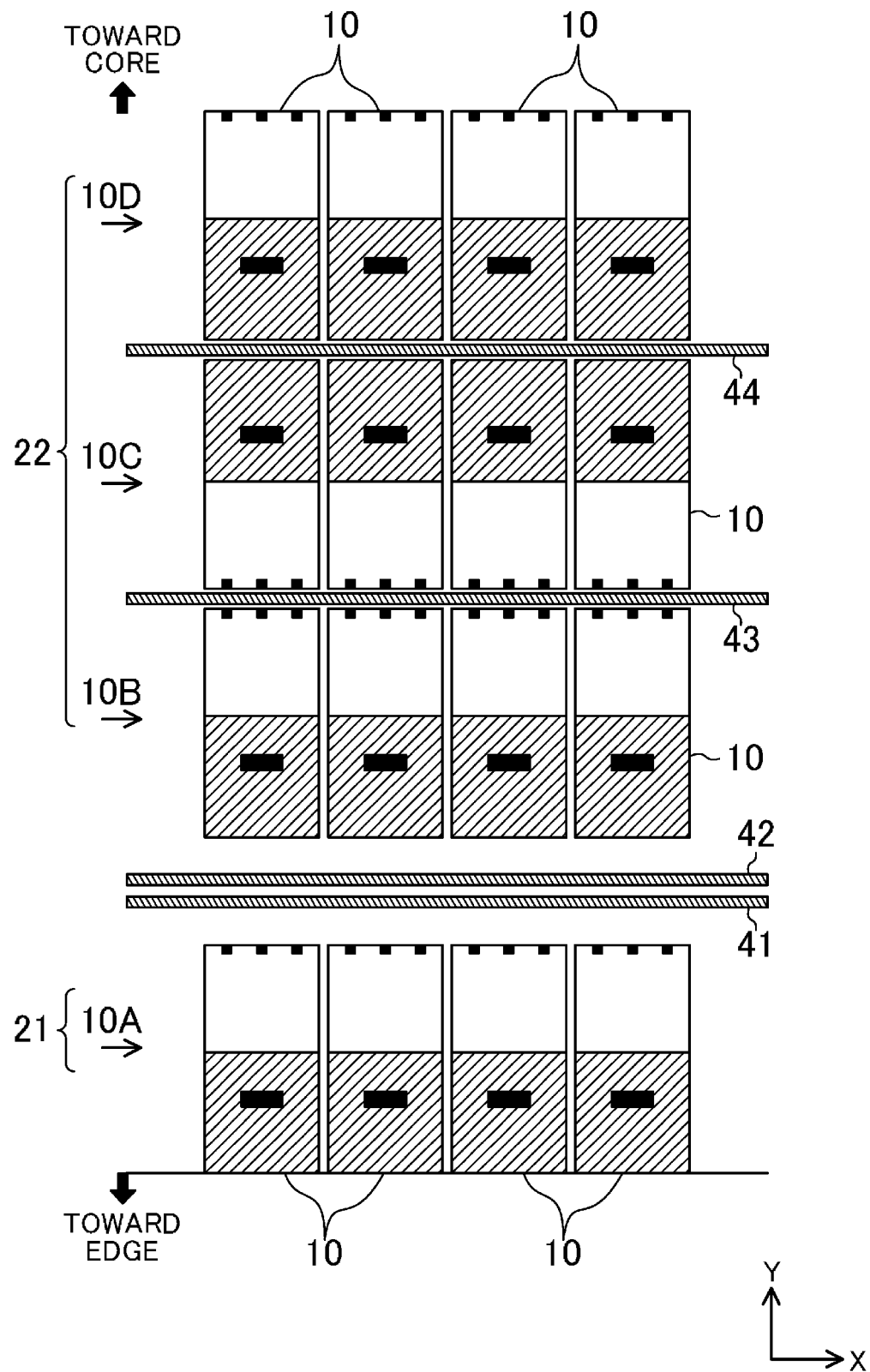
FIG. 8 shows an arrangement of IO cells according to another example.

FIG. 8 shows arrangement of IO cells according to further another example. The arrangement example of FIG. 8 is almost the same as the arrangement example of FIG. 3. However, different from FIG. 3 is that two guard bands 41 and 42 (each corresponding to the "first guard band") extending in the X-direction are arranged in a space (i.e., a distance a) between the first IO cell column group 21 (i.e., the lower power supply voltage region 11 of the IO cell column 10A) and the second IO cell column group 22 (the higher power supply voltage region 12 of the IO cell column 10B). In addition, different from FIG. 3 is that each of guard bands 43 and 44 (corresponding to the "second guard bands") extending in the X-direction is disposed in one of a space (with a distance b) between the IO cell columns 10B and 10C and a space (with a distance b) between the IO cell columns 10C and 10D. The guard bands 41 to 44 are diffusion regions whose potentials are fixed to the power supply or the ground. The arrangement of the guard bands 41 to 44 reduces the propagation of noise. Here, a plurality of (two in FIG. 8) guard bands are arranged in a place where the lower and higher power supply voltage regions 11 and 12 face each other, that is, between the first and second IO cell column groups 21 and 22, in which noise propagation is to be reduced particularly. While an example in FIG. 8 where a plurality of guard bands are arranged as the first guard bands, the configuration is not limited thereto. For example, one first guard band with a greater width than the second guard bands may be used, which provides the same advantage of reducing noise propagation.

In the embodiments described above, the facing IO cells 10 are the same in size and position in the X-direction. The configuration of this embodiment is however not limited thereto.

Figure 9:
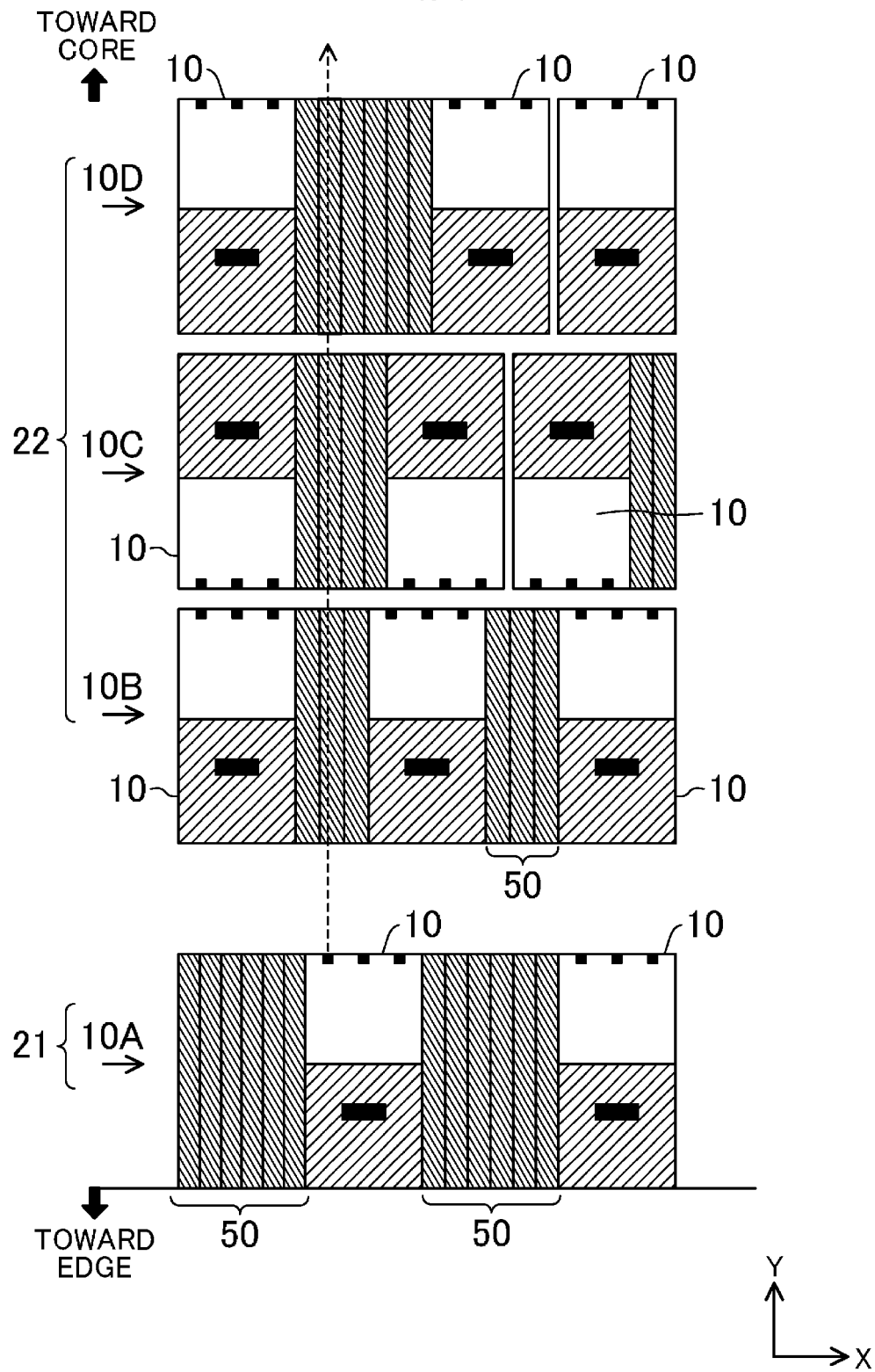
FIG. 9 shows an arrangement of IO cells according to further another example.

FIG. 9 shows arrangement of IO cells according to further another example. The arrangement example of FIG. 9 is almost the same as the arrangement example of FIG. 3. In the arrangement example in FIG. 9, some of the IO cells 10 constituting the IO cell columns 10A to 10D are located in different positions in the X-direction. Filler cells 50 for allowing path of signal wires are arranged in spaces between the IO cells 10 arranged adjacent to each other in the X-direction. As indicated by a broken arrow in FIG. 9, the arrangement of filler cells 50 in the same position as the input/output terminals (e.g., the internal input/output terminals 11a) of the IO cell 10 in the X-direction reduces the length of the connection wire between the input/output terminal (i.e., the internal input/output terminals 11a) and the core region 2. Note that the input/output terminals (e.g., the internal input/output terminals 11a) of the IO cell 10 and the filler cells 50 may be in different positions in the X-direction.

Although not shown, each IO cell 10 may include no filler cell 50 but a region for passing a signal wire.

The present disclosure provides a semiconductor integrated circuit device that reduces wiring delays without causing an increase in the area, and is thus useful for an improvement in the performance such as speeding up of an LSI, for example.

What is claimed is:

1. A semiconductor integrated circuit device comprising:
   a chip;
   a core region on the chip; and
   an IO region provided between the core region and a periphery of the chip on the chip, wherein
   the IO region includes 2×N IO cell columns, where N is an integer of two or more, including a plurality of IO cells aligned in a first direction that is along the periphery of the chip, the IO cell columns being aligned in a second direction perpendicular to the first direction,
   each of the IO cells includes a lower power supply voltage region and a higher power supply voltage region which are separately provided in the second direction,
   the IO cell columns include a first IO cell column group including a first IO cell column in a position closest to the periphery of the chip with the lower power supply voltage region facing the core region, and a second IO cell column group including a second IO cell column in a position closest to the core region with the lower power supply voltage region facing the core region, and
   at least one of the first IO cell column group or the second IO cell column group includes two or more IO cell columns, the two or more IO cell columns being aligned in the second direction such that the lower power supply voltage regions face each other or the higher power supply voltage regions face each other.

2. The semiconductor integrated circuit device of claim 1, wherein
   the first IO cell column group is arranged in one column, and
   the second IO cell column group is arranged in three or more IO cell columns, and the three or more IO cell columns are aligned in the second direction such that the lower power supply voltage regions face each other or the higher power supply voltage regions face each other.

3. The semiconductor integrated circuit device of claim 1, wherein
   the second IO cell column group is arranged in one column, and
   the first IO cell column group is arranged in three or more IO cell columns, and the three or more IO cell columns are aligned in the second direction such that the lower power supply voltage regions face each other or the higher power supply voltage regions face each other.

4. The semiconductor integrated circuit device of claim 1, wherein
   each of the first IO cell column group and the second IO cell column group is arranged in two or more IO cell columns, and the two or more IO cell columns are aligned in the second direction such that the lower power supply voltage regions face each other or the higher power supply voltage regions face each other.

5. The semiconductor integrated circuit device of claim 1, wherein
   a space between the first IO cell column group and the second IO cell column group is wider than a space between adjacent ones of the two or more IO cell columns constituting the first IO cell column group or the second IO cell column group.

6. The semiconductor integrated circuit device of claim 1, wherein
   in each of the IO cell columns, the IO cells are the same in size and position in the second direction.

7. The semiconductor integrated circuit device of claim 1, wherein
   the IO cells facing each other in the second direction are the same in size and position in the first direction.

8. The semiconductor integrated circuit device of claim 1, wherein
   a first guard band extending in the first direction is disposed in a space between the first IO cell column group and the second IO cell column group.

9. The semiconductor integrated circuit device of claim 8, wherein
   a second guard band extending in the first direction is disposed in a space between adjacent ones of the two or more IO cell columns constituting the first IO cell column group and/or the second IO cell column group.

10. The semiconductor integrated circuit device of claim 9, wherein
    the first guard band includes one or more first guard bands, and the second guard band includes one or more second guard bands, and
    the number of the first guard bands is greater than that of the second guard bands.

11. The semiconductor integrated circuit device of claim 9, wherein
    the first guard band has a greater width than the second guard band.

12. The semiconductor integrated circuit device of claim 1, wherein
    each of the IO cell columns includes a filler cell between adjacent two of the TO cells in the first direction.

13. The semiconductor integrated circuit device of claim 12, wherein
    the IO cell columns aligned in the second direction include first filler cells which are the same in position in the first direction.

14. The semiconductor integrated circuit device of claim 13, wherein
    the first filler cell and a terminal provided in the lower power supply voltage region of one of the IO cells at the periphery of the chip are located so as to be the same in position in the first direction.

* * * * *